United States Patent
Buckner et al.

(10) Patent No.: US 9,739,856 B2
(45) Date of Patent: Aug. 22, 2017

(54) MAGNETIC RESONANCE IMAGING METHOD AND APPARATUS WITH INTERLEAVED RESTING STATE FUNCTIONAL MAGNETIC RESONANCE IMAGING SEQUENCES AND MORPHOLOGICAL MAGNETIC RESONANCE IMAGING SEQUENCES

(71) Applicants: Randy Buckner, Cambridge, MA (US); Bjoern Heismann, Erlangen (DE); Arne Hengerer, Moehrendorf (DE)

(72) Inventors: Randy Buckner, Cambridge, MA (US); Bjoern Heismann, Erlangen (DE); Arne Hengerer, Moehrendorf (DE)

(73) Assignees: Siemens Aktiengesellschaft, Munich (DE); Presidents and Fellows of Harvard College, Cambridge, MA (US)

( * ) Notice: Subject to any disclaimer, the term of this patent is extended or adjusted under 35 U.S.C. 154(b) by 1099 days.

(21) Appl. No.: 13/922,568

(22) Filed: Jun. 20, 2013

(65) Prior Publication Data
US 2014/0375314 A1    Dec. 25, 2014

(51) Int. Cl.
*G01V 3/00*    (2006.01)
*G01R 33/48*    (2006.01)

(52) U.S. Cl.
CPC ............... *G01R 33/4806* (2013.01)

(58) Field of Classification Search
CPC .................................. G01R 33/4806
USPC ............... 324/309, 307, 312, 314, 306
See application file for complete search history.

(56) References Cited

U.S. PATENT DOCUMENTS

| | | | |
|---|---|---|---|
| 7,349,728 B2 | 3/2008 | Corchs et al. | |
| 9,510,756 B2* | 12/2016 | Grady | A61B 5/0042 |
| 2013/0267827 A1* | 10/2013 | Grodzki | A61B 5/0042 |
| | | | 600/411 |
| 2013/0320975 A1* | 12/2013 | Heismann | G01R 33/483 |
| | | | 324/309 |
| 2017/0076452 A1* | 3/2017 | Yui | G06T 7/0014 |

OTHER PUBLICATIONS

Biswal et.al.: "Functional Connectivity in the Motor Cortex of Resting Human Brain Using Echo-Planar MRI", Magnetic Resonance Medicine, vol. 34, pp. 537-541, (1995).

Lee et.al.: "Tracking dynamic resting-state networks at higher frequencies using MR-encephalography", NeuroImage, vol. 65, pp. 216-222, (2013).

* cited by examiner

*Primary Examiner* — Louis Arana
(74) *Attorney, Agent, or Firm* — Schiff Hardin LLP (57) ABSTRACT

In a method and apparatus for acquiring magnetic resonance data, a resting state functional magnetic resonance imaging sequence is executed in alternation with a morphological data acquisition sequence. The alternating sequences are executed with no time interruptions therebetween, with at least one repetition of the alternating sequences. The resting state functional magnetic resonance imaging sequence can be a BOLD-EPI sequence, and the morphological imaging sequence can be an MPRAGE sequence.

20 Claims, 4 Drawing Sheets

MAGNETIC RESONANCE IMAGING METHOD AND APPARATUS WITH INTERLEAVED RESTING STATE FUNCTIONAL MAGNETIC RESONANCE IMAGING SEQUENCES AND MORPHOLOGICAL MAGNETIC RESONANCE IMAGING SEQUENCES

BACKGROUND OF THE INVENTION

Field of the Invention

The present invention is concerned with a method and an apparatus for resting state functional magnetic resonance imaging (rsfMRI).

Description of the Prior Art

Magnetic resonance imaging is an imaging modality that makes use of the fact that different types of nuclei are resonant at respectively different frequencies in a magnetic field of a given field strength. Each type of nuclei exhibits a property known as the gyromagnetic ratio, which causes that nucleus to resonate at a specific frequency in the presence of a magnetic field of a specific field strength. The nuclei are initially aligned by the strong magnetic field, and, by the application of radio-frequency (RF) energy thereto, are deflected by an angle (called the "flip angle") from the aligned state. As the deflected nuclei return to the aligned state, they emit RF signals (magnetic resonance signals) which are detected and processed in order to generate a magnetic resonance image.

A special category of magnetic resonance imaging is functional magnetic resonance imaging (fMRI). As explained in U.S. Pat. No. 7,349,728 (the teachings of which are incorporated herein by reference), functional magnetic resonance tomography makes use of the fact that the oxygen content of blood influences its magnetic properties. The magnetic resonance characteristics, and thus the magnetic resonance signal generated by blood, change with the content of oxygenated or de-oxygenated hemoglobin. Therefore, blood behaves in functional magnetic resonance tomography in the manner of a contrast medium. With a high proportion of de-oxygenated hemoglobin, as a result of its paramagnetic characteristics in the environment of the blood vessels, a local magnetic field gradient is induced which, with a suitable choice of a magnetic resonance tomography sequence, a localized signal reduction will occur. If the proportion of oxygenated hemoglobin in the blood increases, an effect known as the susceptibility effect decreases, which leads to an increase in the measured signal. This relationship is referred to as the BOLD (blood oxygen level dependent) contrast, or BOLD effect. With increasing field strength, this effect is increased. Magnetic resonance devices (scanners) that generate a basic magnetic field strength of 1.5 Tesla and higher are used for fMRI.

The magnetic resonance sequence that is typically used in fMRI is an echo planar imaging sequence, so that fMRT is a type of echo planar imaging.

The local changes of the oxygen content in the blood can be caused, for example, by intentionally subjecting the patient to one or more sensory inputs (such as light, sound or touch) at known times, and the fMRI image will enable a physician to identify the location in the brain at which increased brain activity occurs as a result of the stimulus.

Resting state fMRI (rsfMRI) is a form of fMRI wherein BOLD signals are acquired from a subject with no external stimuli being applied. The BOLD signals are then statistically analyzed to determine degrees of connectivity between various regions of the brain. In general, the greater that a low frequency (such as below approximately 0.1 Hz) modulation of the BOLD signals between two brain regions is correlated over time, the higher the respective connectivity between those two regions.

This technique is robust with individual patients, and allows the same scan to be used to survey multiple brain systems, in contrast to conventional task-based BOLD examinations. Investigations have shown that rsfMRI can be used to identify brain systems that are associated with motor function, and associated with cognition, including language and memory. Major clinical applications include early stage diagnosis of Alzheimer's disease, grading depression severity, pre-surgical planning, and transcranial magnetic stimulation (TMS) targeting. In clinical practice, rsfMRI sequences are commonly used in conjunction with structural or anatomical (morphological) sequences, such as a 3D MPRAGE (Magnetization Prepared Rapid Gradient Echo) sequence. Conventionally, data are acquired from the examination subject using an rsfMRI sequence, and then a separate examination takes place wherein data are acquired from the subject using a morphological sequence, such as MPRAGE. For example, in early stage diagnosis of Alzheimer's disease, rsfMRI data are combined, after such separated acquisitions, with morphological MRI data, from which brain atrophy can be identified from the structural sequence. In pre-surgical planning for temporal lobe epilepsy and tumor reception, and TMS targeting for depression, the functional measurements acquired from the rsfMRI data are directly referenced to the anatomical structural data acquired from the morphological sequence from the same patient.

In view of the need to acquire data both in a structural sequence and in an rsfMRI sequence, the overall measurement (data acquisition) time can be prolonged so as to have a duration of 15 to 30 minutes. This can present a significant problem in the case of elderly patients, demented patients, or severely depressed patients. It is thus of major interest to significantly reduce the total measurement time in these types of examinations.

SUMMARY OF THE INVENTION

In accordance with the invention, functional rsfMRI sequences are interleaved with morphological MR sequences, allowing acquisition (measurement) of both functional data and morphological data in rapid succession, with no time interruptions between successive sequences, so as to reduce the total scan time by approximately half the time required for conventional, time-separated functional data acquisition and morphological data acquisition.

The present invention encompasses a method for acquiring functional and morphological magnetic resonance data wherein multiple rsfMRI sequences are interleaved with multiple morphological data acquisition sequences. As used herein, "interleaved" means that the respective different types of sequences alternate in time with each other with no time gap or interruption between any two successive sequences.

The invention also encompasses a magnetic resonance imaging apparatus that is operable to implement such a method as well as a non-transitory, computer-readable data storage medium encoded with programming instructions that, when the storage medium is loaded into a computerized control unit of a magnetic resonance imaging apparatus, caused the apparatus to execute the method in accordance with the invention.

The rsfMRI sequence is preferably an EPI-BOLD sequence, and the morphological imaging sequence is preferably an MPRAGE sequence.

The invention is based on the insight that the functional data are band-limited, allowing for interleaving with time constants in the range of sub-seconds.

As is known in magnetic resonance imaging, the raw data acquired from the examination subject are entered into a memory in an organized manner, this memory format being known as k-space. K-space can be two-dimensional or three-dimensional, and includes multiple points at which respective data entries are made. The filling of k-space (i.e., entering data values into k-space at the respective points thereof) is known as scanning or sampling k-space, and the sequence and path along which respective data points in k-space are filled is known as a k-space trajectory. In accordance with the present invention, a linear (line-by-line) trajectory can be used, but optimized k-space trajectories such as spirals and radial paths can also be used, in order to reduce acoustic noise.

As noted above, current research indicates that resting state functional information is band-limited to a window around 0.1 Hz. Therefore, according to the Nyquist theorem, a morphological sequence component can be interleaved with resting state functional information, without loss of information, up to a certain limit of the switching time, i.e., the respective durations of the interleaved sequences. If it is assumed, for example, that a conventional rsfMRI EPI sequence is used, that repeatedly scans 2D or 3D k-space in a non-segmented or segmented fashion, after k-space readouts of rsfMRI information for a duration of $dt_1$ seconds, a morphological readout sequence such as MPRAGE can be implemented for a duration of $dt_2$ seconds, and so on. In a preferred embodiment, $dt_1=dt_2=0.1$ s, up to 5 s-$\Delta$, with $\Delta$ being the aforementioned time limit that accounts for the bandwidth. For example, $\Delta=1$ s. This allows recovery of the most important phase information around the center frequency of 0.1 Hz.

Other research has noted, however, that resting state modulations may also occur around higher carrier frequencies, such as around 0.3 Hz, which would reduce $dt_1=dt_2$ to a range between 0.1 s and 1.5 s-$\Delta$. This means that the filling should be open to higher frequencies. Moreover, the two time windows for the functional and morphological data acquisition might be different from each other, and might be incremented or decremented by constant values, or even randomly, throughout the overall data acquisition sequence.

As noted above, the morphological sequence can be a sequence that is optimized to minimize acoustic noise, such as a sequence using radial or spiral trajectories for entering data into k-space, with minimized gradient slew rate and gradient vector angular speeds.

Likewise, the BOLD-EPI rsfMRI sequence may also use radial or spiral EPI sequences for the same purpose. Both optimizations are for the purpose of minimizing the acoustic impact on the patient, thereby improving comfort of the patient during the scan.

DESCRIPTION OF THE PREFERRED EMBODIMENTS

Figure 1:
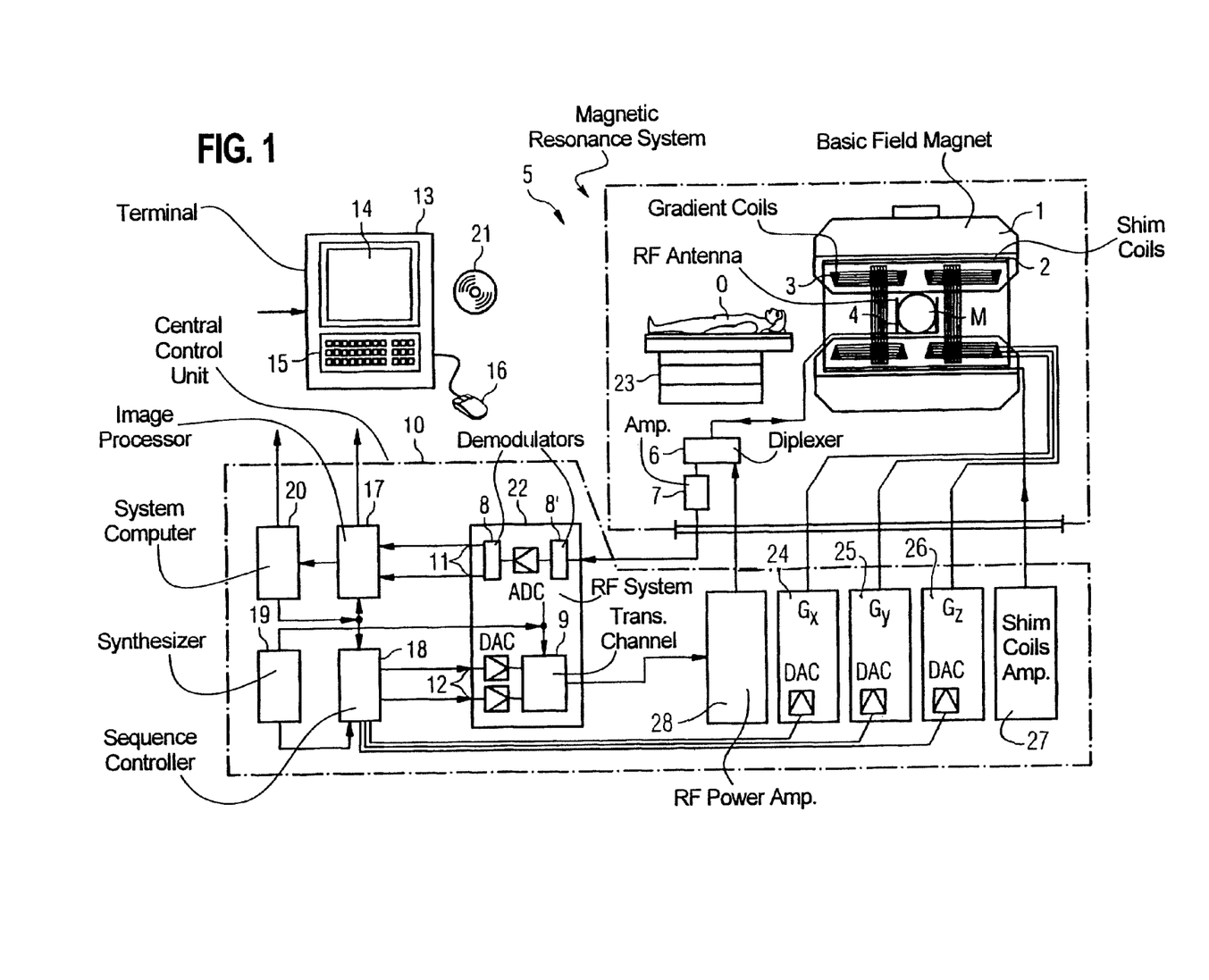
FIG. 1 schematically illustrates a magnetic resonance imaging (tomography) apparatus that is operable to implement the method according to the invention.

FIG. 1 shows a magnetic resonance system 5 (a magnetic resonance imaging (magnetic resonance tomography) apparatus). A basic field magnet 1 generates a temporally constant, strong magnetic field for polarization or alignment of the nuclear spins in an examination region of an examination subject U, for example of a part of a human body that is to be examined, which body lies on a table 23 and is slid into the magnetic resonance system 5. The high homogeneity of the basic magnetic field that is required for the magnetic resonance measurement (data acquisition) is defined in a typically spherical measurement volume M into which the parts of the human body that are to be examined are introduced. Shim plates made of ferromagnetic material are attached at a suitable point to assist the homogeneity requirements, and in particular to eliminate temporally invariable influences. Temporally variable influences are eliminated by shim coils 2 and a suitable control 27 for the shim coils 2.

A cylindrical gradient coil system 3 composed of three sub-windings is used in the basic field magnet 1. Each sub-winding is supplied with current by a corresponding amplifier 24-26 to generate a linear gradient field in a respective direction of the Cartesian coordinate system. The first sub-winding of the gradient field system 3 generates a gradient $G_x$ in the x-direction; the second sub-winding generates a gradient $G_y$ in the y-direction; and the third sub-winding generates a gradient $G_z$ in the z-direction. Each of the amplifiers 24-26 has a digital/analog converter (DAC), which is activated by a sequence controller 18 for accurately-timed generation of gradient pulses.

A radio-frequency antenna 4 that converts the radio-frequency pulses emitted by a radio-frequency power amplifier into an alternating magnetic field for excitation of the nuclei and alignment of the nuclear spins of the subject to be examined or of the region of the subject that is to be examined is located within the gradient field system 3. The radio-frequency antenna 4 is composed of one or more RF transmission coils and one or more RF reception coils in the form of an annular, linear or matrix-like arrangement, for example. The alternating field emanating from the precessing nuclear spins—i.e. normally the nuclear spin echo signals caused by a pulse sequence composed of one or more radio-frequency pulses and one or more gradient pulses—is also converted by the RF reception coils of the radio-frequency antenna 4 into a voltage (measurement signal), which is supplied via an amplifier 7 to radio-frequency reception channels 8, 8' of a radio-frequency system 22. The radio-frequency system 22 furthermore has a transmission channel 9 in which the radio-frequency pulses are generated for the excitation of nuclear magnetic resonance. The respective radio-frequency pulses are digitally represented in the sequence controller 18 as a series of complex numbers based on a pulse sequence predetermined by the system computer 20. This number sequence is supplied as a real part and imaginary part to a digital/analog converters (DAC) in the radio-frequency system 22 via respective inputs 12 and from said digital/analog converter (DAC) to the transmission channel 9. In the transmission channel 9 the pulse sequences are modulated on a radio-frequency carrier signal having a base frequency that corresponds to the resonance frequency of the nuclear spins in the measurement volume. The modulated pulse sequences of the RF transmission coils are supplied to the radio-frequency antenna 4 via an amplifier 28.

Switching from transmission operation to reception operation takes place via a transmission/reception diplexer 6. The RF transmission coil of the radio-frequency antenna 4 radiates the radio-frequency pulses for excitation of the nuclear spins into the measurement volume M and scans resulting echo signals via the RF reception coils. The acquired nuclear magnetic resonance signals are phase-sensitively demodulated to an intermediate frequency in a first demodulator 8' of the reception channel of the radio-frequency system 22 and are digitized in an analog/digital converter (ADC). This signal is further demodulated to a frequency of zero. The demodulation to a frequency of zero and the separation into real part and imaginary part occur in a second demodulator 8 after the digitization in the digital domain. The demodulator 8 supplies the demodulated data to an image computer 17 via outputs 11. An MR image can be reconstructed by the image computer 17 from the measurement data acquired in such a manner.

The administration of the measurement data, the image data and the control programs takes place via the system computer 20. The system computer 20 has a module to determine a phase shift of a measurement data set 20.1, a module to calculate a relevant phase shift from determined phase shifts 20.2, and a module to determine a B1 distribution from a relevant phase shift 20.3. The intermediate results (that arise in the processing of the measurement data in the system computer 20) and results—in particular specific B1 distributions—can be stored and/or displayed for further use, for example in subsequent MR measurements.

Based on a specification with control programs, the sequence controller 18 monitors the generation of the respective desired pulse sequences and the corresponding scanning of k-space. In particular, the sequence controller 18 controls the time-accurate switching of the gradients, the emission of the radio-frequency pulses with defined phase amplitude and the reception of the nuclear magnetic resonance signals. The time base for the radio-frequency system 22 and the sequence controller 18 is provided by a synthesizer 19. The selection of corresponding control programs to generate an MR image (which control programs are stored on a DVD 21, for example) and other inputs on the part of the user (such as a desired frequency, in particular of non-resonant RF pulses) and a presentation of generated MR images take place via a terminal 13 that has input means to enable an input (for example a keyboard 15 and/or a mouse 16) and display means (a monitor 14, for example) to enable a display.

Figure 2:
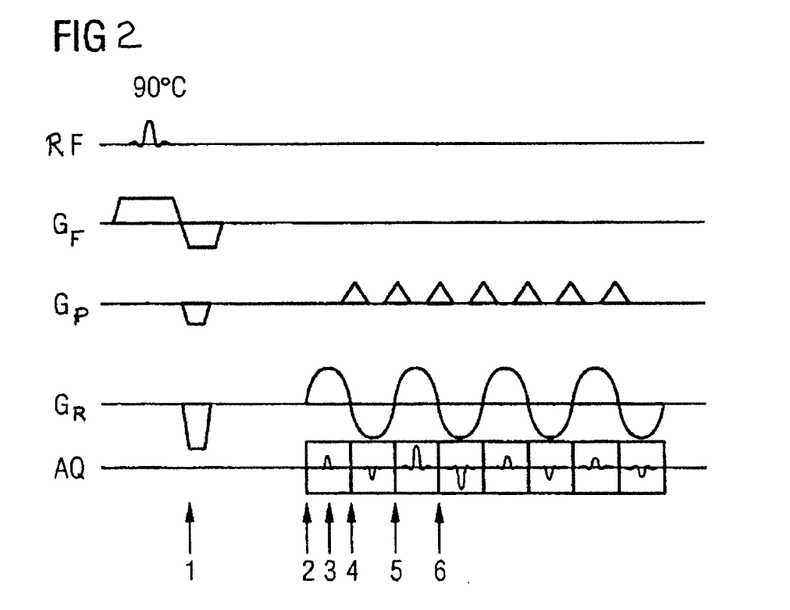
FIG. 2 schematically illustrates a conventional echo planar imaging (EPI) sequence for the acquisition of magnetic resonance data.
Figure 3:
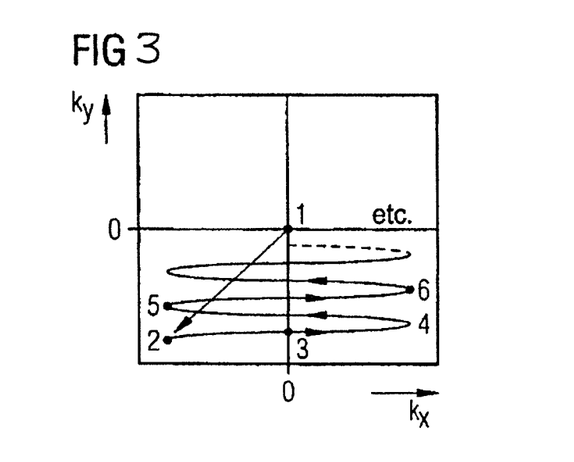
FIG. 3 schematically illustrates the entry of data into k-space, using the sequence shown in FIG. 2.

FIG. 2 shows the characteristic features of an echo planar imaging (EPI) sequence, of the type used to acquire functional magnetic resonance data by means of the BOLD effect. FIG. 3 schematically illustrates the entry of data into k-space, correlated with the sequence shown in FIG. 2.

In the embodiment of EPI shown in FIG. 1, an RF excitation pulse (which may be a 90 degree pulse as shown in FIG. 2) is radiated, which can be made slice-selective by contemporaneous activation of a slice-selective gradient $G_f$, which may also be used for frequency coding. An orthogonal gradient $G_P$ is radiated for phase coding of the acquired signals. The imaging sequence is repeated multiple times for different values of the phase coding gradient $G_P$. The resulting magnetic resonance signal is digitized and stored in each repetition of the sequence, in the presence of a readout gradient $G_R$. A numerical matrix in k-space is thereby filled, as shown in FIG. 3 in the case of a 2D k-space having directions $k_x$ and $k_y$. With an appropriate sequence, however, data may be entered into a 3D k-space matrix.

As shown in FIG. 2, multiple phase-coded echoes are used to fill the k-space matrix. The basis of this sequence is to generate a series of echoes in the readout direction (i.e., the direction of the readout gradient $G_R$) after a single, selective RF excitation. The echoes are associated by suitable modulation of the phase coding gradient $G_P$ with different lines in k-space.

In the embodiment shown in FIG. 2, after the 90 degree RF excitation pulse and a refocusing pulse, multiple gradient echoes are generated by an oscillating frequency coding gradient in the readout direction. The phase coding in this embodiment ensues by means of small gradient pulses in the range of the zero crossing of the oscillating frequency coding gradient (shown on line AQ in FIG. 1). This results in a serpentine data entry path (trajectory) in the spatial frequency domain represented by the k-space matrix shown in FIG. 2. It should be noted, however, that other EPI sequences can be used that result in spiral or radial scanning of k-space.

Figure 4:
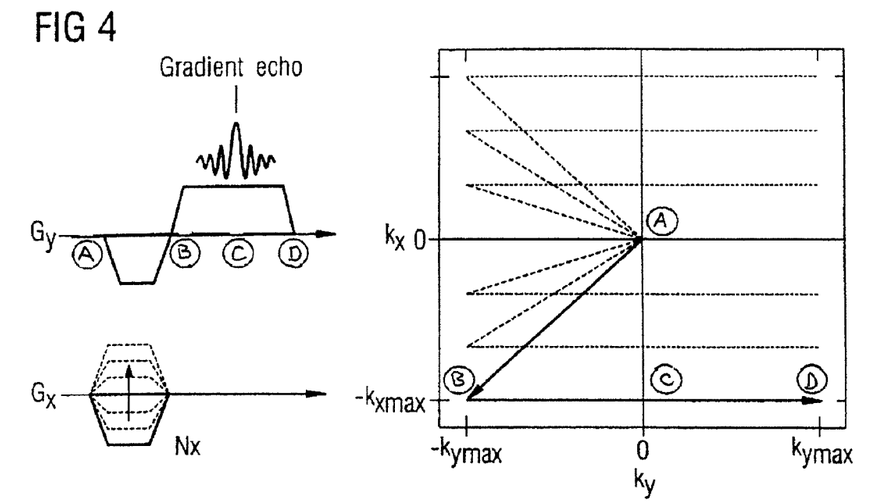
FIG. 4 schematically illustrates the principles of a gradient echo sequence for the acquisition of morphological magnetic resonance data.

The aforementioned MPRAGE sequence, which is the preferred sequence for use in accordance with the present invention for morphological magnetic resonance image data acquisition, is a sequence in the family of sequences that are collectively referred to as gradient echo sequences. The basic characteristics of a gradient echo sequence are schematically illustrated in FIG. 4. In this pulse sequence, after the RF pulse, the signal is located in the center of k-space, as indicated at A. A de-phasing of the signal occurs at point B, due to the phase coding gradients and the de-phasing in the readout direction. A line of k-space is scanned, as indicated at C and D during the reverse-polarized readout gradients, and the signal is acquired. The gradient echo occurs at C. The entire process is repeated $N_x$ times, with phase coding gradients of respectively different strengths, such that the entirety of k-space is filled with data (scanned).

Figure 5:
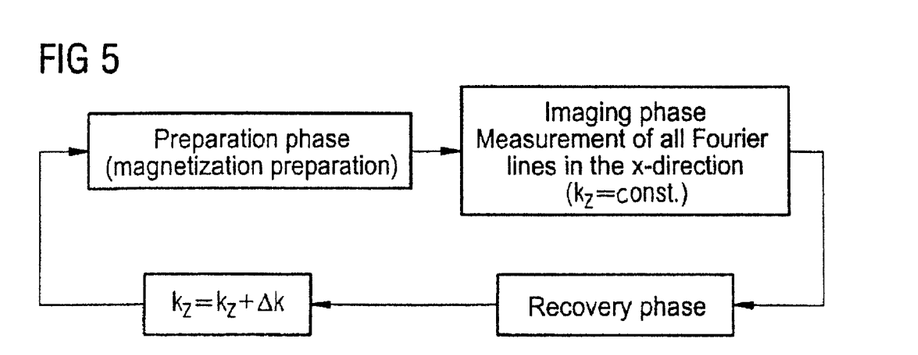
FIG. 5 is a flowchart illustrating the principles of the MPRAGE sequence for acquiring morphological magnetic resonance data.

FIG. 5 shows the basic principle of the MPRAGE sequence. This is based on the 3D Fourier technique as well as the magnetization preparation. A preparation phase is activated before the actual image phase, in order to achieve shorter measurement times and a good tissue contrast. The preparation phase effects a preparation of the magnetization that is dependent on the relaxation times T1 and T2. The magnetization prepared in this manner is spatially coded and scanned using the gradient echo sequence shown in FIG. 4. FIG. 5 schematically illustrates the workflow of the MPRAGE sequence, in which a magnetization preparation initially occurs, and in the imaging phase all Fourier lines are subsequently acquired in the x direction, given a constant value $K_z$ along the z axis. A recovery phase follows for a better signal-to-noise ratio, and thus a better contrast, and the sequence is subsequently repeated for further values of $k_z$, as indicated by the increment $\Delta k$.

The MPRAGE sequence is usually the sequence of choice for depiction of T1-weighted images of the head with good contrast between gray and white brain matters, and a good contrast between cerebrospinal fluid (CSF) and gray brain matter.

Figure 6:
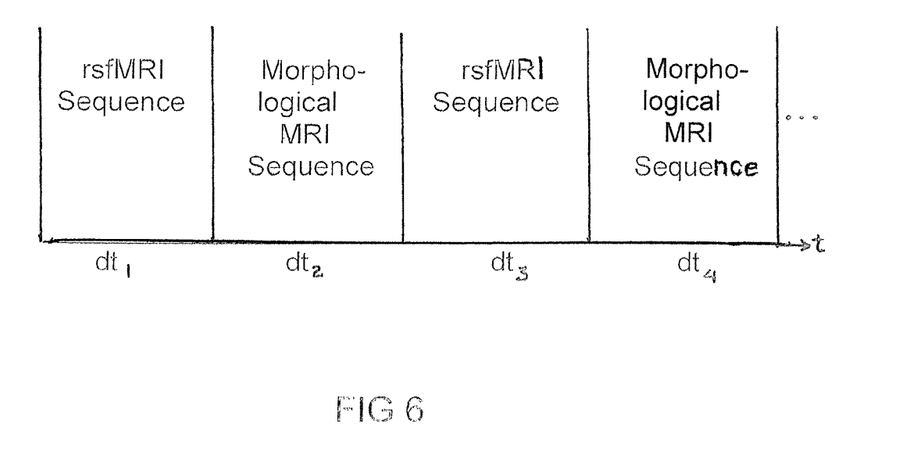
FIG. 6 schematically illustrates the interleaving of a functional magnetic resonance data acquisition sequence with a morphological magnetic resonance data acquisition sequence, in accordance with the present invention.

FIG. 6 schematically illustrates the method according to the invention, wherein a magnetic resonance apparatus of the type shown in FIG. 1 is caused to operate to execute alternating rsfMRI sequences and morphological MRI sequences. Four such alternating sequences are shown in FIG. 6, but more may be implemented. Each sequence has a respective duration $dt_1$, $dt_2$, $dt_3$, $dt_4$, etc. It may be the case that all of these durations are equal, but it may also be the case that each duration is different, or incrementally or decrementally changing durations may be used, or randomly changing durations may be used. As noted above, preferably all durations are in a range between 0.1 s and 5 s-$\Delta$, wherein $\Delta$ accounts for the bandwidth of the band-limited functional magnetic resonance information, with $\Delta=1$ s, for example. If resting state modulations are found to occur at higher center frequencies, such as around 0.3 Hz, the durations may be in a range between 0.1 s and 1.5 s-$\Delta$.

The magnetic resonance apparatus shown in FIG. 1 is caused to execute the sequences shown in FIG. 6 by virtue of programming instructions that are encoded on a storage medium, such as the DVD 21 shown in FIG. 1, which is loaded into the control unit represented by the terminal 13 in FIG. 1.

Although modifications and changes may be suggested by those skilled in the art, it is the intention of the inventors to embody within the patent warranted hereon all changes and modifications as reasonably and properly come within their scope of contribution to the art.

We claim as our invention:

1. A method for acquiring magnetic resonance data from an examination subject, comprising:
   (a) operating a magnetic resonance data acquisition unit, with an examination subject therein, to execute a resting state functional magnetic resonance imaging (rsfMRI) sequence to acquire functional magnetic resonance data from the examination subject;
   (b) immediately following (a), with no time interruption, operating said magnetic resonance data acquisition unit to execute a morphological magnetic resonance data acquisition sequence, to acquire morphological magnetic resonance data from the examination subject;
   (c) immediately following (b), with no time interruption, repeating (a) and (b) at least once; and
   (d) processing said functional magnetic resonance data and said morphological magnetic resonance data in a computerized processor to obtain processed functional magnetic resonance image data and processed morphological magnetic resonance image data, and making said processed functional magnetic resonance image data and said processed morphological image data available in electronic form at an output of said processor, in respective data files.

2. A method as claimed in claim 1 comprising operating said magnetic resonance data acquisition unit with a BOLD-EPI (Blood Oxygen Level Dependent-Echo Planar Imaging) sequence as said rsfMRI sequence.

3. A method as claimed in claim 1 comprising operating said magnetic resonance data acquisition unit with an MPRAGE (Magnetization-Prepared Rapid Gradient Echo) sequence as said morphological data acquisition sequence.

4. A method as claimed in claim 1 comprising operating said magnetic resonance data acquisition unit with a BOLD-EPI (Blood Oxygen Level Dependent-Echo Planar Imaging) sequence as said rsfMRI sequence, and operating said magnetic resonance data acquisition unit with an MPRAGE (Magnetization-Prepared Rapid Gradient Echo) sequence as said morphological data acquisition sequence.

5. A method as claimed in claim 1 comprising operating said magnetic resonance data acquisition unit to execute said rsfMRI sequence with a functional sequence duration, and operating said magnetic resonance data acquisition unit to execute said morphological data acquisition sequence with a morphological sequence duration that is equal to said functional sequence duration in (b) and in all repetitions of (a) and (b).

6. A method as claimed in claim 1 comprising operating said magnetic resonance data acquisition unit to execute said rsfMRI sequence with a functional sequence duration, and operating said magnetic resonance data acquisition unit to execute said morphological data acquisition sequence with a morphological sequence duration that is different from said functional sequence duration in (b) and in at least some repetitions of (a) and (b).

7. A method as claimed in claim 5 wherein said functional magnetic resonance image data is band-limited to a bandwidth that imposes a sampling time limit $\Delta$ according to the Nyquist theorem, and comprising operating said magnetic resonance data acquisition unit with each of said functional sequence duration and said morphological sequence duration being in a range between 0.1 s and 5 s-$\Delta$.

8. A method as claimed in claim 5 wherein said functional magnetic resonance image data is band-limited to a bandwidth that imposes a sampling time limit $\Delta$ according to the Nyquist theorem, and comprising operating said magnetic resonance data acquisition unit with each of said functional sequence duration and said morphological sequence duration being in a range between 0.1 s and 1.5 s-$\Delta$.

9. A magnetic resonance apparatus comprising:
   a magnetic resonance data acquisition unit;
   a control unit configured to operate said magnetic resonance data acquisition unit, with an examination subject therein, to execute a resting state functional magnetic resonance imaging (rsfMRI) sequence to acquire functional magnetic resonance data from the examination subject;
   said control unit being configured to operate said magnetic resonance data acquisition unit immediately following said rsfMRI sequence, with no time interruption, to execute a morphological magnetic resonance data acquisition sequence, to acquire morphological magnetic resonance data from the examination subject;
   said control unit being configured to operate said magnetic resonance data acquisition unit immediately following said morphological data acquisition sequence, with no time interruption, to repeat said rsfMRI sequence and said morphological magnetic data acquisition sequence at least once; and
   a computerized processor configured to process said functional magnetic resonance data and said morphological magnetic resonance data to obtain processed functional magnetic resonance image data and processed morphological magnetic resonance image data, and to make said processed functional magnetic resonance image data and said processed morphological image data available in electronic form at an output of said processor, in respective data files.

10. A magnetic resonance apparatus as claimed in claim 9 wherein said control unit is configured to operate said magnetic resonance data acquisition unit with a BOLD-EPI (Blood Oxygen Level Dependent-Echo Planar Imaging) sequence as said rsfMRI sequence.

11. A magnetic resonance apparatus as claimed in claim 9 wherein said control unit is configured to operate said magnetic resonance data acquisition unit with an MPRAGE (Magnetization-Prepared Rapid Gradient Echo) sequence as said morphological data acquisition sequence.

12. A magnetic resonance apparatus as claimed in claim 9 wherein said control unit is configured to operate said magnetic resonance data acquisition unit with a BOLD-EPI (Blood Oxygen Level Dependent-Echo Planar Imaging) sequence as said rsfMRI sequence, and to operate said magnetic resonance data acquisition unit with an MPRAGE (Magnetization-Prepared Rapid Gradient Echo) sequence as said morphological data acquisition sequence.

13. A magnetic resonance apparatus as claimed in claim 9 wherein said control unit is configured to operate said magnetic resonance data acquisition unit to execute said rsfMRI sequence with a functional sequence duration, and to operate said magnetic resonance data acquisition unit to execute said morphological data acquisition sequence with a morphological sequence duration that is equal to said functional sequence duration and in all repetitions of said rsfMRI sequence and said morphological data acquisition sequence.

14. A magnetic resonance apparatus as claimed in claim 9 wherein said control unit is configured to operate said magnetic resonance data acquisition unit to execute said rsfMRI sequence with a functional sequence duration, and to operate said magnetic resonance data acquisition unit to execute said morphological data acquisition sequence with a morphological sequence duration that is different from said functional sequence duration in (b) and at least some repetitions of (c).

15. A magnetic resonance apparatus as claimed in claim 9 wherein said functional magnetic resonance image data is band-limited to a bandwidth that imposes a sampling time limit $\Delta$ according to the Nyquist theorem, and wherein said control unit is configured to operate said magnetic resonance data acquisition unit with each of said functional sequence duration and said morphological sequence duration being in a range between 0.1 s and 5 s-$\Delta$.

16. A magnetic resonance apparatus as claimed in claim 9 wherein said functional magnetic resonance image data is band-limited to a bandwidth that imposes a sampling time limit $\Delta$ according to the Nyquist theorem, and wherein said control unit is configured to operate said magnetic resonance data acquisition unit with each of said functional sequence duration and said morphological sequence duration being in a range between 0.1 s and 1.5 s -$\Delta$.

17. A non-transitory, computer-readable data storage medium encoded with programming instructions, said storage medium being loadable into a computerized control and processing system of a magnetic resonance apparatus that also comprises a magnetic resonance data acquisition unit, said programming instructions causing said control and processing system to:
(a) operate said magnetic resonance data acquisition unit, with an examination subject therein, to execute a resting state functional magnetic resonance imaging (rsfMRI) sequence to acquire functional magnetic resonance data from the examination subject;
(b) immediately following (a), with no time interruption, operate said magnetic resonance data acquisition unit to execute a morphological magnetic resonance data acquisition sequence, to acquire morphological magnetic resonance data from the examination subject;
(c) immediately following (b), with no time interruption, repeat (a) and (b) at least once; and
(d) process said functional magnetic resonance data and said morphological magnetic resonance data to obtain processed functional magnetic resonance image data and processed morphological magnetic resonance image data, and to make said processed functional magnetic resonance image data and said processed morphological image data available in electronic form at an output of said control and processing system, in respective data files.

18. A method for acquiring magnetic resonance data, comprising:
operating a magnetic resonance data acquisition unit to execute a plurality of interleaved alternations of two magnetic resonance data acquisition sequences, selected from the group consisting of a resting state functional magnetic resonance data acquisition sequence and a morphological magnetic resonance data acquisition sequence, with no time interruptions between any successive sequences, in order to acquire functional magnetic resonance data from an examination subject and morphological magnetic resonance data from the examination subject; and
in a computerized processor processing said functional magnetic resonance data and said morphological magnetic resonance data to obtain processed functional magnetic resonance image data and processed morphological magnetic resonance image data, and making said processed functional magnetic resonance image data and said processed morphological image data available in electronic form at an output of said processor, in respective data files.

19. A magnetic resonance apparatus, comprising:
a magnetic resonance data acquisition unit;
a control unit configured to operate a magnetic resonance data acquisition unit to execute a plurality of alternations of two magnetic resonance data acquisition sequences, selected from the group consisting of a resting state functional magnetic resonance data acquisition sequence and a morphological magnetic resonance data acquisition sequence, with no time interruptions between successive sequences, in order to acquire functional magnetic resonance data from an examination subject and morphological magnetic resonance data from the examination subject; and
a computerized processor configured to process said functional magnetic resonance data and said morphological magnetic resonance data to obtain processed functional magnetic resonance image data and processed morphological magnetic resonance image data, and to make said processed functional magnetic resonance imaging data and said processed morphological image data available in electronic form at an output of said processor, in respective data files.

20. A non-transitory, computer-readable data storage medium encoded with programming instructions, said storage medium being loadable into a computerized control and processing system of a magnetic resonance apparatus that also comprises a magnetic resonance data acquisition unit, said programming instructions causing said control and processing system to:
operate said magnetic resonance data acquisition unit to execute a plurality of interleaved alternations of two magnetic resonance data acquisition sequences, selected from the group consisting of a resting state functional magnetic resonance data acquisition sequence and a morphological magnetic resonance data acquisition sequence, with no time interruptions between successive sequences, in order to acquire functional magnetic resonance data from an examination subject and morphological magnetic resonance data from the examination subject; and process said functional magnetic resonance data and said morphological magnetic resonance data to obtain processed functional magnetic resonance image data and processed morphological magnetic resonance image data, and make said processed functional magnetic resonance imaging data and said processed morphological image data available in electronic form at an output of said processor, in respective data files.

\* \* \* \* \*